United States Patent
Burr

[19]

[11] Patent Number: 6,048,746
[45] Date of Patent: Apr. 11, 2000

[54] METHOD FOR MAKING DIE-COMPENSATED THRESHOLD TUNING CIRCUIT

[75] Inventor: James B. Burr, Foster City, Calif.

[73] Assignee: Sun Microsystems, Inc., Palo Alto, Calif.

[21] Appl. No.: 09/092,906

[22] Filed: Jun. 8, 1998

[51] Int. Cl.[7] .............................. G01R 31/26; H01L 21/66
[52] U.S. Cl. .............................. 438/17; 438/800; 438/18; 438/14
[58] Field of Search .................................. 438/17, 18, 14

[56] References Cited

U.S. PATENT DOCUMENTS 4,142,114  2/1979  Green ...................................... 327/536

FOREIGN PATENT DOCUMENTS 410199260A  1/1997  Japan .

Primary Examiner—Charles Bowers
Assistant Examiner—Craig Thompson

[57] ABSTRACT

To compensate for process, activity and environmental variations in a semiconductor device, a back-bias potential tuning circuit is formed on a semiconductor die. The tuning circuit tunes a bias potential applied to the semiconductor die to maintain a predetermined ratio between a transistor on-current and a transistor off-current through at least one channel region. Then, a leakage current is measured for multiple transistors formed in the semiconductor die to determine a representative leakage of the semiconductor die. Tuning characteristics of the back-bias potential tuning circuit are then set to match the representative leakage of the semiconductor die.

18 Claims, 6 Drawing Sheets

6,048,746

METHOD FOR MAKING DIE-COMPENSATED THRESHOLD TUNING CIRCUIT

BACKGROUND OF THE INVENTION

1. Field of the Invention

The present invention generally relates to semiconductor devices, and in particular, the present invention relates to a device and method for adjusting a substrate bias potential to compensate for process, activity and temperature-induced device threshold variations.

2. Description of the Related Art

FIG. 1 illustrates an example of a back-biased n-channel device. That is, in the exemplary MOS configuration of FIG. 1, the NFET 101 is a four-terminal device, and is made up of an n-region source 104, a gate electrode 103, an n-region drain 102, and a p⁻bulk substrate 105. The substrate or bulk 105 of the NFET 101 is biased to Vbs (as explained below) by way of a metallic back plane 106.

FIG. 2 is a circuit representation of the NFET 101 of FIG. 1. As shown, Vgs is the voltage across the gate G and the source S, Vds is the voltage across the drain D and the source S, and Vbs is the voltage across the substrate B and the source S. Reference character Id denotes the drain (or channel) current.

There are a number of factors which contribute to the magnitude of a transistor device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations, charge trapping in the materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations. This can be accomplished using back biasing, i.e. controlling the potential between a device's substrate and source. See James B. Burr, "Stanford Ultra Low Power CMOS," Symposium Record, Hot Chips V, pp. 7.4.1–7.4.12, Stanford, Calif. 1993, which is incorporated herein by reference for all purposes.

A basic characteristic of back-biased transistors resides in the ability to electrically tune the transistor thresholds. This is achieved by biasing the bulk of each MOS transistor relative to the source to adjust the threshold potentials. Typically, as shown in FIG. 1, the potential will be controlled through isolated ohmic contacts to the source and bulk regions together with circuitry necessary for independently controlling the potential of these two regions.

However, as the threshold voltage varies with temperature and other factors, there exists a need to dynamically adjust the substrate bias voltage to compensate for such temperature induced variations in device performance. Furthermore, global process variations that would otherwise shift the threshold voltage should also be compensated by applying the appropriate offset to the substrate. While various techniques are known for adjusting the substrate bias, they tend to be complex and expensive, and in some cases ineffective, particularly for low and near zero threshold voltage devices.

SUMMARY OF THE INVENTION

It is an object of the present invention to provide a method and device which reduce the impact of on-chip threshold variations which can cause a test circuit to exhibit a threshold voltage which is different than the threshold voltages of devices contained in the critical paths of the chip.

It is a further object of the present invention to provide a method and device in which delay characteristics of both a critical path and a test transistor of a test circuit are measured, and either an offset is applied to the back bias based on a measured discrepancy, or a number of possible test transistors is selected which closely models the critical path.

According to one aspect of the invention, a method of forming a semiconductor device is provided which includes forming a back-bias potential tuning circuit which tunes a bias potential applied to a semiconductor die to bring a threshold voltage of at least one channel region within the semiconductor die to a target value; measuring a leakage current of multiple transistors formed in the semiconductor die; determining a representative leakage of the semiconductor die from the measured leakage of the multiple transistors; and setting a tuning characteristic of the back-bias potential tuning circuit to match the representative leakage of the semiconductor die. The back-bias potential tuning circuit may be formed on or off the semiconductor die.

According to another aspect of the present invention, a method of forming a semiconductor device is provided which includes forming a back-bias potential tuning circuit which tunes a bias potential applied to a semiconductor die to bring a threshold voltage of at least one channel region within the semiconductor die to a target value; subjecting the semiconductor die to worst case operating conditions and determining a target back-bias potential at which the semiconductor die is operational under the worst case operating conditions; and setting a tuning characteristic of the back-bias potential tuning circuit to cause the tuning circuit to generate the target back-bias potential under the worst case operating conditions. Again, the tuning circuit may be formed on or off the semiconductor die.

According to another aspect of the present invention, the tuning characteristic is set by selecting at least one of the multiple transistors for use as a test transistor in the back-bias potential tuning circuit.

According to another aspect of the present invention, the tuning characteristic is set by mechanically trimming a width of a test transistor of the back-bias potential tuning circuit.

According to another aspect of the present invention, the tuning characteristic is set by activating selected transistors among a bank of parallel connected transistors, and using the activated transistors as a test transistor of the back-bias potential tuning circuit.

According to another aspect of the present invention, the back-bias tuning circuit includes a capacitor which is charged via a second transistor during an on-interval of the second transistor and which is discharged via a first transistor during an off-interval of the second transistor. The back-bias tuning circuit brings the threshold voltage to the target voltage by measuring a voltage of the capacitor at a sampling time of the off-interval of the second transistor, and controlling a back-bias potential to bring the measured voltage to a target voltage. The setting a tuning characteristic includes setting the sampling time at which the voltage of the capacitor is measured during the off-interval of the second transistor.

According to another aspect of the present invention, the back-bias tuning circuit brings the threshold voltage to the target voltage by measuring a current ratio between an on transistor and an off transistor, and controlling a back-bias potential to bring the measured current ratio to a target ratio. The setting a tuning characteristic includes setting a ratio between a channel width of the off transistor and a channel width of the on transistor. And according to another aspect of the present invention, the target ratio is between 10 and 10,000 inclusive.

As described above and hereinafter, the bias potential is said to be applied to the semiconductor die. In the case of bulk CMOS and partially depleted SOI devices, this means that the back bias potential is applied to the undepleted bulk material adjacent the depleted channel region of the devices. In the case of fully depleted SOI devices, this means that the back bias potential is applied to an electrode spaced from the fully depleted channel region by an insulating layer.

DETAILED DESCRIPTION OF THE PREFERRED EMBODIMENTS

Figure 1:
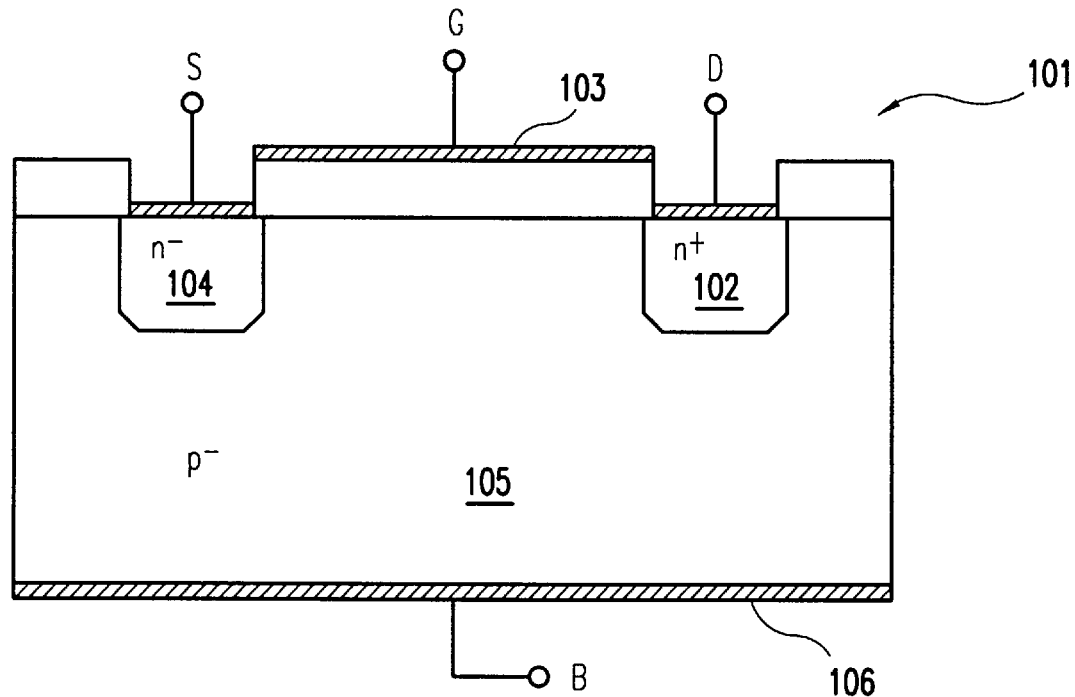
FIG. 1 illustrates a conventional back-biased n-channel MOS configuration.
Figure 2:
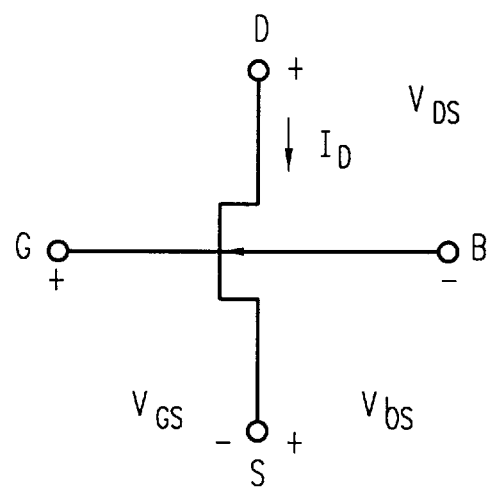
FIG. 2 is a circuit representation of the n-channel MOS configuration of FIG. 1.

When designing a transistor circuit to operate at a certain supply voltage Vdd, a threshold for that particular Vdd is set as a target. According to the present invention, and as demonstrated below, the right target depends on a ratio of $I_{on}/I_{off}$, where $I_{on}$ is the on-current through a device and $I_{off}$ is the off-current through the device. More precisely, $I_{on}$ is the drain current of a transistor under the condition Vgs=Vds=Vdd, and $I_{off}$ is the drain current under the condition Vgs=0 and Vds=Vdd. As also shown below, the ratio $I_{on}/I_{off}$ is in turn set according to an effective logic depth and activity of the circuit design.

By equating the ac power $P_{ac}$ to the dc power $P_{dc}$ at any given switching node, in other words, by making the switching power equal to the leakage power, the overall energy efficiency is maximized. $P_{ac}$ and $P_{dc}$ may be characterized as follows:

$$P_{ac}=a \cdot c \cdot v^2 \cdot f \text{ and } P_{dc}=I_{off} \cdot v$$

where $$f = \frac{I_{on} - I_{off}}{ld \cdot c \cdot v}$$

and where c is the charge at the node in question, v is the voltage (Vdd) at the node, ld is the effective logic depth of the circuit (which basically defines how fast the circuit operates, i.e., the number of gates between laches, such that the gate delay times the logic depth is equal to the clock period), and a is the activity of the circuit, i.e., the probability that a given node will switch on a given cycle. If a is very high, that means the circuit components are subject to substantial switching.

Again, optimal operation is achieved at $P_{ac}$ and $P_{dc}$. In this condition, the following derivations are achieved:

$$a \cdot c \cdot v^2 \cdot \frac{I_{on} - I_{off}}{ld \cdot c \cdot v} = I_{off} \cdot v$$

$$\frac{ld}{a} = \frac{I_{on} - I_{off}}{I_{off}}$$

$$\frac{ld}{a} \cong \frac{I_{on}}{I_{off}}$$

As such, an optimal design point for the system may be characterized as follows:

$$\frac{I_{on}}{I_{off}} \to \frac{ld}{a}$$

In a typical microprocessor, ld is around 20, and a is around 0.2 to 0.5. This means to achieve optimum performance, the ratio of $I_{on}/I_{off}$ current should be about 100. However, in typical transistors, this ratio is more on the order of $10^8$, and thus such transistors lack energy efficiency. By operating at much lower thresholds, the present technology provides a mechanism for achieving higher energy efficiency as a result of the use of smaller supply voltages, without unduly impacting performance, despite the increased leakage.

If ld is fixed, which it is by the architecture, and if a is statistically fixed or known by the work being carried out, that means that $I_{on}/I_{off}$ should be some constant. In fact, if the circuit is running at a particular Vdd, then ld/a is a minimum value of $I_{on}/I_{off}$ which can be tolerated and still achieve good energy efficiency. Thus, the fact that $I_{on}/I_{off}$ should be greater than (or no less than) ld/a defines an energy bound.

$$\frac{I_{on}}{I_{off}} \geq \frac{ld}{a} \text{(energy bound)}$$

However, there is also a functionality bound. Circuits are typically designed for worst case $I_{off}$. In other words, the circuit is constructed and then subjected to worst case off current to make certain that the circuit functions at that worse case off current. Likewise, a particular $I_{on}/I_{off}$ constant defines a functionality bound or performance bound.

$$\frac{I_{on}}{I_{off}} \geq \text{constant (functionality bound)}$$

$$\frac{I_{on}}{I_{off}} \leq \text{constant (perfomance bound)}$$

There are several sources of variations for both on current and off current. One is process variations, such as doping inconsistencies, dimensional inaccuracies, and process induced charge trappings in the materials and interfaces. Another is environmental variations, such as temperature fluctuations and environmentally induced charge trappings. Yet another is operational variations, such as drain-induced barrier lowering and operationally induced charge trappings due to hot carrier effects. Further, such variations encompass both global variations and local variations. Local variations are variations which exist between transistors on the same chip or between transistors with a single functional domain of the chip, whereas global variations are those which exist from die to die and also from wafer to wafer.

Figure 3:
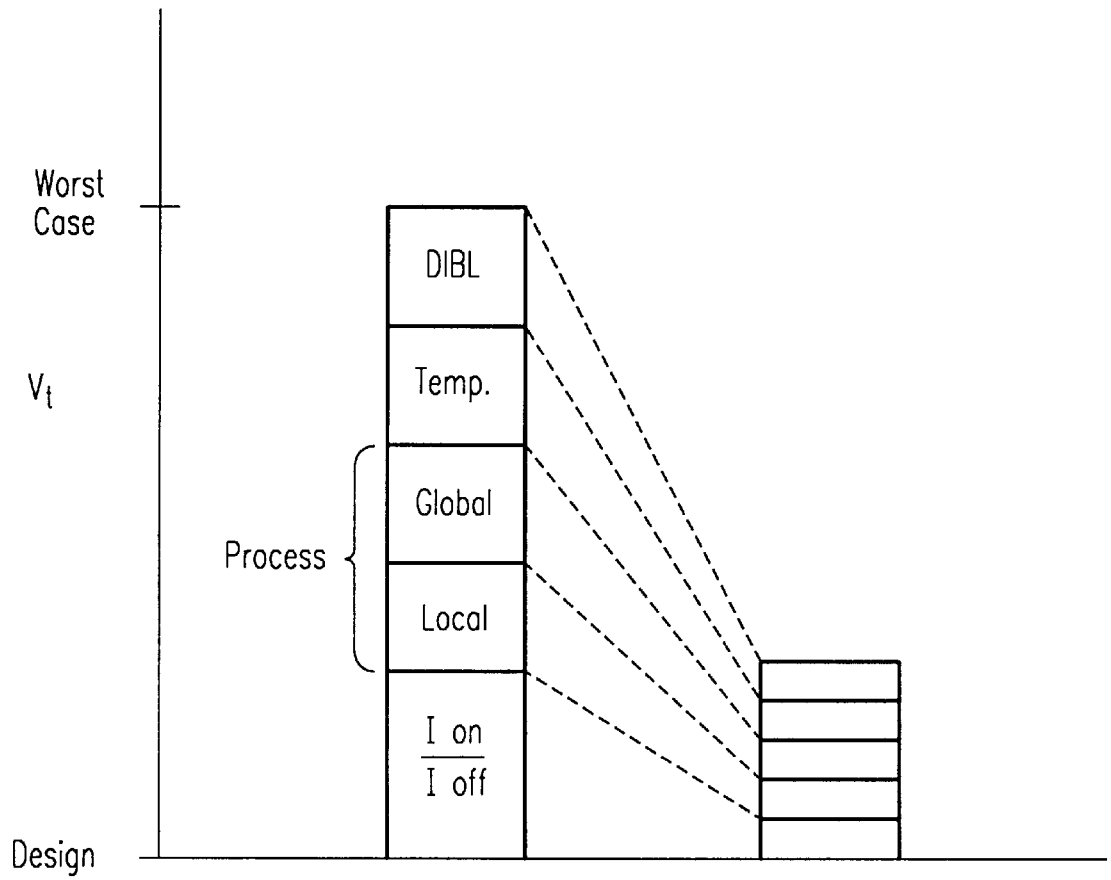
FIG. 3 is a diagram generally illustrating the effect of process and other variations on the performance value of a device's threshold voltage.

FIG. 3 is a diagram generally illustrating the effect of such variations on the performance value of Vt. As illustrated by the left-hand bar of FIG. 3, a design value of Vt is adjusted upward to cover worst cases scenarios brought about by the worst case Ion/Ioff, global and local process variations, temperature variations, and DIBL (drain induced barrier lowering—which causes the threshold voltage to decrease with increasing supply voltage). However, by placing a threshold tuning circuit (described below) on a single die, it is possible to largely compensate for all but the local process variations. That means, as shown by the right-hand bar of FIG. 3, a worst case Vt can be set which is much lower than the previous worst case Vt.

Moreover, the $I_{on}/I_{off}$ ratio of the preferred embodiment of the present invention is much smaller than it is for a standard system, thus substantially reducing the $I_{on}/I_{off}$ component of the variations shown in FIG. 3. Standard practice would suggest setting $I_{on}/I_{off}$ for worst case activity (i.e., standby mode where activity is very small). The present approach sets $I_{on}/I_{off}$ for optimum activity, which in active circuits is several orders of magnitude larger than worst case activity. Also, in the case of low threshold voltage CMOS (LVCMOS) devices, lower doping levels are employed, thus reducing the local variations as compared to those of a standard die. As such, the threshold can be designed within a much smaller range as shown in FIG. 3.

This present embodiment is thus directed to precisely controlling the back bias to maintain $I_{on}/I_{off}$ at a target value. For example, if the die heats up, the threshold is going to tend to go down and $I_{off}$ will to tend to go up, and so the back bias is increased. Likewise, if the supply voltage goes up, the threshold will tend to go down and $I_{off}$ will tend to go up, and so the back bias is also increased.

Figure 4:
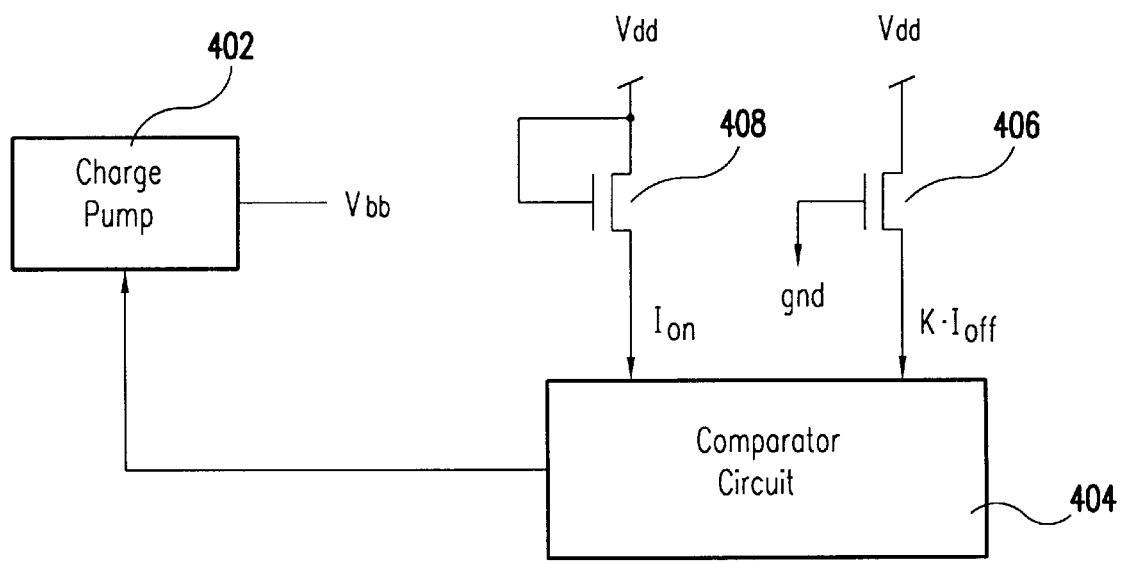
FIG. 4 is a circuit diagram illustrating one embodiment of the present invention for maintaining a constant ratio between $I_{on}$ and $I_{off}$.

FIG. 4 illustrates one embodiment of the present invention for maintaining a target ratio of $I_{on}/I_{off}$. Reference numeral 402 is a bias voltage generator such as a charge pump. Charge pumps are known in the art and may be readily employed to vary well bias voltages. Such pump circuits can be constructed so as to be responsive to two types of inputs, one that instructs the pump to "increase the back bias", and another that instructs the pump to "decrease the back bias".

Reference numeral 404 is a comparator circuit which compares $I_{on}$ and $K \cdot I_{off}$ (described below). An exemplary implementation of the comparator circuit 404 is the known "current mirror", which compares two input currents and adjusts an output voltage depending on which current is larger. The current mirror can be used with suitable interface circuitry to drive the charge pump.

An aspect of the present embodiment resides in constructing two current sources which are equal when the ratio of the ON current and the OFF current is at the desired value. This ratio typically ranges from 10 to 10,000, depending on the application. For LVCMOS, an example target ratio is about 100 for active logic and 1,000 for memory elements.

As shown in FIG. 4, one simple embodiment is to construct a first transistor 406 that is K times the width of a second transistor 408. The first transistor is hardwired OFF (gate to ground, source to ground, drain to Vdd). The second transistor is hardwired ON (gate to Vdd, source to ground, drain to Vdd). The ratio K is the target ratio of $I_{on}/I_{off}$. By constructing the transistor 406 to have a width that is K times the width of the transistor 408, the OFF current of the transistor 406 will equal the ON current of the transistor 408 when the $I_{on}/I_{off}$ target value is met.

Figure 5:
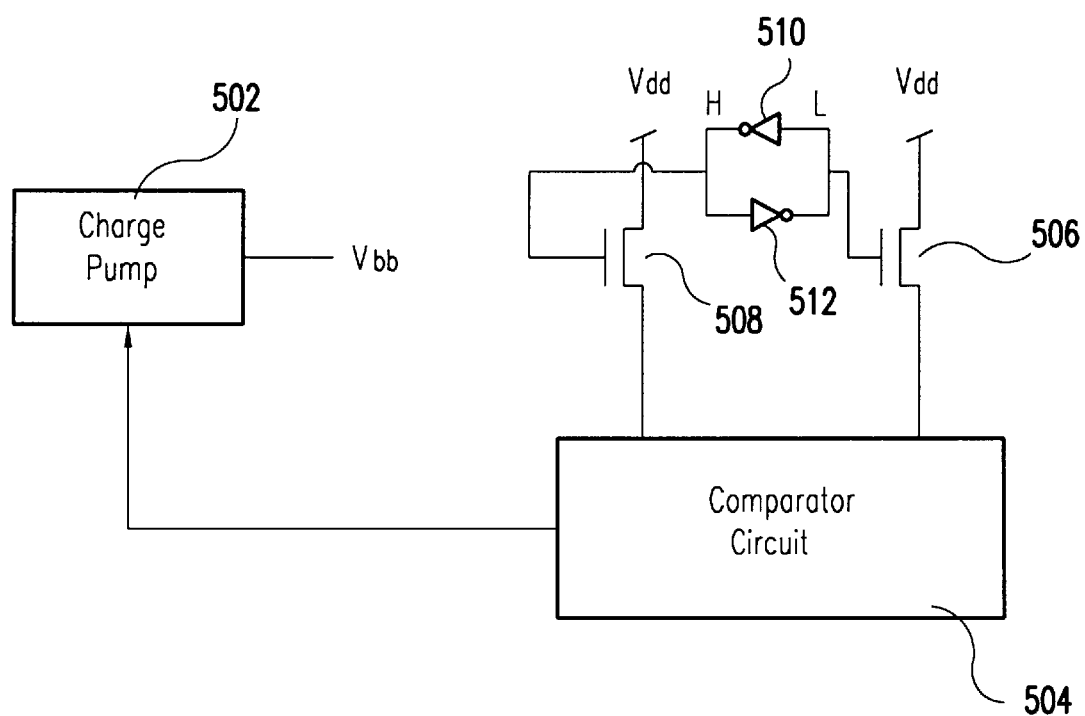
FIG. 5 is a circuit diagram showing the use of cross-coupled inverters to drive gates of the test transistors.

For small values of $I_{on}/I_{off}$, the outputs do not swing to the rails. In this case, the circuit may be modified so that the OFF transistor gate is driven by the low output of two cross-coupled inverters. This configuration is illustrated in FIG. 5. As shown, the gate of the ON transistor 508 is driven by the high output of cross coupled inverters 510 and 512, whereas the OFF transistor 506 is driven by the low output of the cross coupled inverters 510 and 512. The cross coupled inverters 510 and 512 must be biased correctly on power-on. One way to do this, not central to the invention and thus not shown, is to pull the low side to ground through an nfet whose gate is connected to ground, and/or to pull the high side up through a pfet whose gate is connected to Vdd.

In the first embodiment of FIGS. 4 and 5, the width Woff of the OFF transistor is K times the width Won of the ON transistor, and K equals the target value of $I_{on}/I_{off}$. It is noted, however, the K may instead represent a multiple of $I_{on}/I_{off}$ and vice versa. The comparator in this case would be configured to compare a fractional value of $I_{on}$ against $I_{off}$ (where K is a multiple of $I_{on}/I_{off}$), or a fractional value of $I_{off}$ against $I_{on}$ (where $I_{on}/I_{off}$ is a multiple of K). In other words, in the case where K=b·$I_{on}/I_{off}$ (targeted), the comparator is configured to drive the charge pump such that a steady state of b·$I_{on}$ (detected)=$I_{off}$ (detected) is achieved. Conversely, in the case where $I_{on}/I_{off}$ (targeted)=b·K, the comparator is configured to drive the charge pump such that a steady state of b·$I_{off}$ (detected)=$I_{on}$ is achieved. In both cases, b is a positive integer.

One potential drawback of the configurations of FIGS. 4 and 5 resides in the current drain of the circuit. Even in the case where the ON transistor 408 is a minimum size transistor, the current drain may be on the order of 100 $\mu$A, resulting in a continuous drain of both transistors on the order of 200 $\mu$A. While such power dissipation may be acceptable in some high wattage circuits, it may be excessive in others. That is, the continuous ON current of even a single minimum size transistor is quite large in ultra low power applications.

To reduce power consumption, one alternative is to turn the Ion/Ioff detector circuit on briefly, and adjust the back bias based on a latched value. In other words, a sample-and-hold scheme may be adopted in which the detector is turned on, and the output value is latched and held. In this regard, it is noted that process related variations in $I_{on}/I_{off}$ are set at the factory, i.e., such variations are not dynamic. Further, charge trapping induced variations tend to occur at a relatively slow rate. And while there may be some noise in the supply voltage (DIBL variations), the most significant dynamic variations are temperature related. Even so, in these systems, the time constants for temperature variations are very large. For example, it takes on the order of 10 milliseconds for the die to respond to a change in temperature sufficient to cause a significant shift in the threshold voltage. As such, because the environmentally induced variations change so slowly, the tuning circuit may have a duty cycle of a few nanoseconds per millisecond, thus reducing DC leakage power in the circuit by four to six orders of magnitude. This reduces the average current of the ON transistor from 100's of microamps to about 1 nanoamp.

Figure 6:
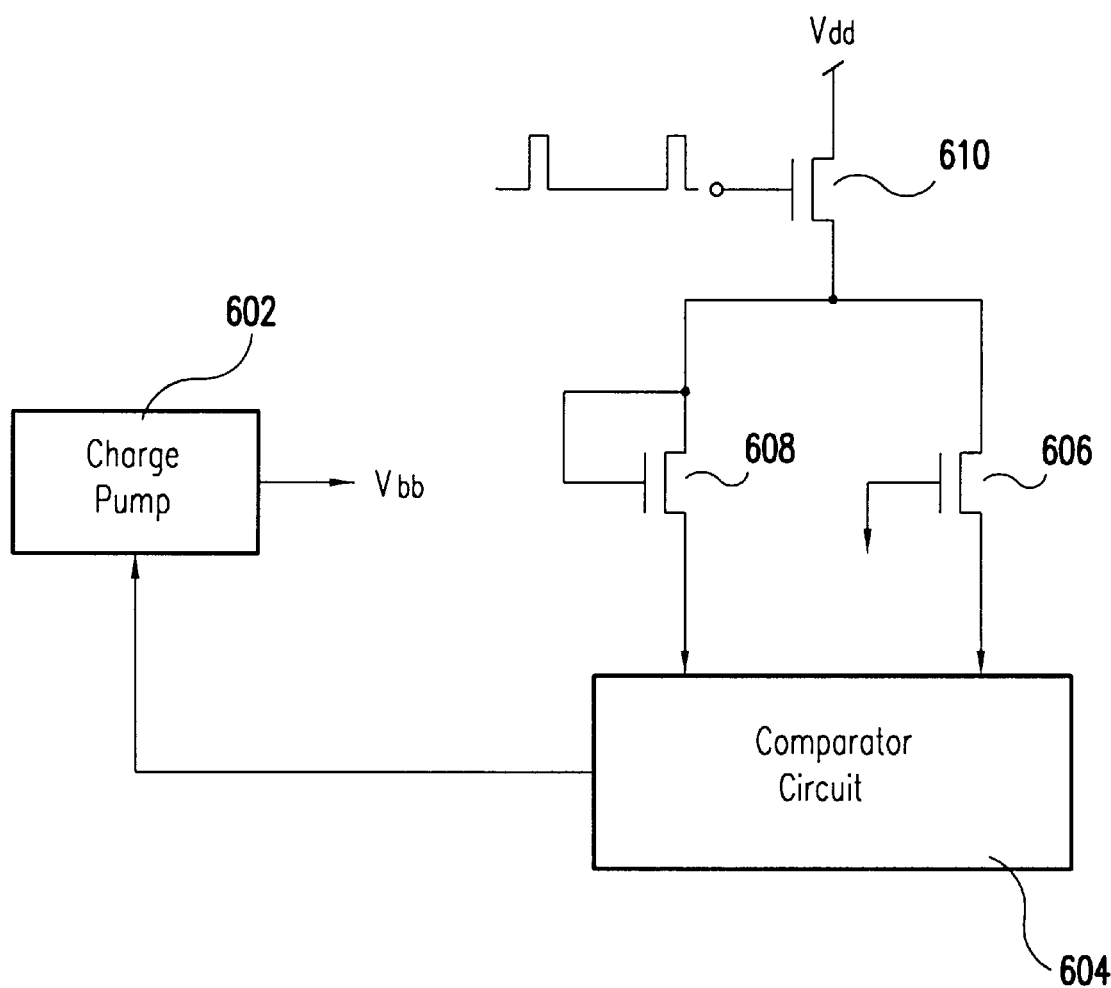
FIG. 6 is a circuit diagram showing a sampling mechanism for sampling the on and off currents of the transistor devices.

FIG. 6 illustrates a simple circuit configuration for reducing power consumption by sampling as described above. The supply voltage Vdd is applied on a sampled basis to the ON transistor 608 and the OFF transistor 606 by a transistor 610. The gate of the transistor 610 is supplied with a sampling signal having a duty cycle as described above. The comparator circuit is supplied with a latch to hold the output of the ON transistor 606 and the OFF transistor 608 at each sampling period. Of course, any voltage drop attributable to the presence of the transistor 610 must be taken into account when comparing $I_{on}$ and $I_{off}$.

Another technique for reducing power consumption is to adopt a sampling scheme in which both the ON transistor and the OFF transistor are small (e.g., both have minimum widths). In fact, according to this technique, the ON and OFF transistors can be the same size. The $I_{on}/I_{off}$ ratio is measured in this case by varying the amount of time a capacitor is charged and discharged by the transistors.

Figure 7:
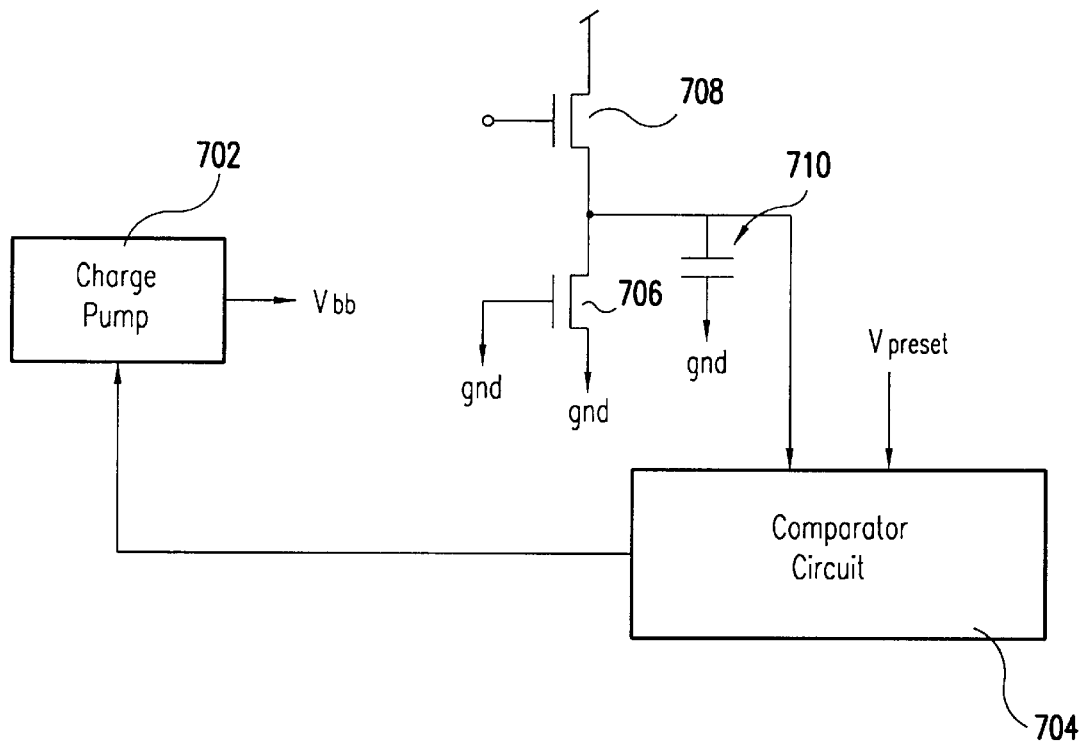
FIG. 7 is a circuit diagram showing a configuration in which a capacitor is charged and discharged to measure the on and off currents of the transistor devices.

FIG. 7 illustrates one embodiment, by way of example, of using the discharge time of a capacitor to measure $I_{on}/I_{off}$. In the case where an ON transistor 708 is an nfet, the ON transistor 708 is connected to Vdd and receives a sampling pulse at its gate. In the case where an OFF transistor 706 is also an nfet, the OFF transistor 706 is connected between the ON transistor 708 and ground. Connected across the OFF transistor 706 is a capacitor 710. A high impedance (low leakage) comparator circuit 704 is coupled to the capacitor 710. In all, four combinations of nfets and/or pfet may be implemented as the ON and OFF transistors 708 and 706, only one such combination (i.e., two nfets) being shown in FIG. 7. The remaining unillustrated combinations would have the effect of altering the polarities of the connections of the transistors and/or capacitor. Each combination is encompassed by the present invention.

In operation, the capacitor is charged to some preset value. Then additional charged is supplied to the capacitor via the ON transistor 708 by switching on the ON transistor during a pulse period t. Then, once the ON transistor turns off, the capacitor is discharged via the OFF transistor 706. The capacitor voltage is then sampled at time K·t, where K is equal to the target value of $I_{on}/I_{off}$. In the case where the actual value of $I_{on}/I_{off}$ is equal to the target value of $I_{on}/I_{off}$, the total DC current drain via the ON transistor during time t will roughly equal the total DC current drain via the OFF transistor during time K·t. As such, the sampled capacitor voltage will have returned to the preset voltage. The case where the sampled capacitor voltage exceeds the preset voltage is indicative of $I_{on}/I_{off}$ being in excess of the target K, and the case where the sampled capacitor voltage is less then the preset voltage is indicative the actual $I_{on}/I_{off}$ being less then the target K. In either case, the comparator circuit 704 adjusts the substrate bias potential accordingly by way of the charge pump 702.

To compensate for variations among transistors on the die, it may be necessary to set the sampling interval (K·t) based on the relationship between $I_{off}$ of the test OFF transistor and $I_{off}$ of a "nominal" transistor on the die. Assuming $K_{nom}$ to be the target $I_{on}/I_{off}$ ratio of a nominal structure, $K_{test}$ to be the corresponding $I_{on}/I_{off}$ ratio of the test structure, Ir(nom) to be the measured $I_{on}/I_{off}$ ratio of a nominal structure, and Ir(test) to be the measured $I_{on}/I_{off}$ ratio of the test structure, then $$\frac{K_{test}}{Ir(\text{test})} = \frac{K_{nom}}{Ir(\text{nom})} \text{ and,}$$

$$Ir(\text{nom}) = \frac{Ion(\text{nom})}{Ioff(\text{nom})} \quad Ir(\text{test}) = \frac{Ion(\text{test})}{Ioff(\text{test})}$$

where Ion(nom) is $I_{on}$ of the nominal structure, Ioff(nom) is $I_{off}$ of the nominal structure, Ion(test) is $I_{on}$ of the test structure, and Ioff(test) is $I_{off}$ of the test structure. Further assuming the difference be Ion(nom) and Ion(test) to be negligible as noted previously, and thereby assuming Ion (nom)=Ion(test), then $$K_{nom} \cdot Ioff(\text{nom}) = K_{test} \cdot Ioff(\text{test})$$

and therefore $$K_{test} = K_{nom} \frac{Ioff(\text{nom})}{Ioff(\text{test})}$$

The sampling time of the capacitor is thus set to $K_{test}$·t, where t is the duration of the on period of the ON transistor. It may be desirable to periodically recalibrate Ktest over the life of the chip due to drifts in relative on and off currents of the nominal and/or test structures.

Again, this approach has the advantage that the OFF transistor can be small. In particular, in the case where the ON transistor 708 is overdriven to an off state, both transistors can be of the same size and have minimum widths. In the case where the ON transistor 708 is not overdriven to an off state, then the OFF transistor should preferably be larger, e.g., 10 times larger in width than the ON transistor. If the capacitor is of modest size, for example 1 pF, then a 1 um wide transistor with a Gm=100 uA/um/V could charge up to Vdd in about 10 nsec. Then, if the transistor were turned off, the OFF transistor would discharge the capacitor in 1 usec if Ion/Ioff=100. The power dissipated by this circuit would be $cv^2f$=1e−12·$Vdd^2$·1e3=1 nW at 1V if operated at 1 KHz.

Figure 8:
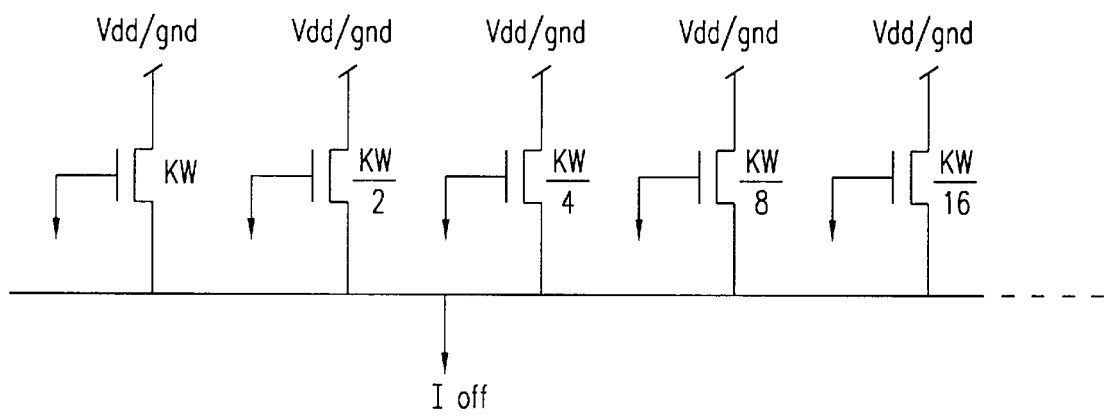
FIG. 8 is a circuit diagram of a bank of off transistors each having differing widths.

Yet another modification of the present invention is shown by the embodiment of FIG. 8. The configuration of FIG. 8 can be readily employed as a die compensation mechanism. That is, since Ioff varies much more than Ion, and thus the tuning circuit sensitivity is higher with respect to Ioff than Ion, in many cases it may be desirable to tune Ioff in some manner prior to initializing the circuit into operation. This may be done, for example, using the configuration of FIG. 8 to select, as the off transistor, an appropriate combination of transistors from among a bank of transistors. Of course, other techniques may be adopted as well, such as trimming the width of the off transistor.

This embodiment of FIG. 8 may also be employed to account for varying activity levels of the circuit operation, such as active, snooze and sleep modes. As already discussed, the ratio $I_{on}/I_{off}$ is inversely proportional to the activity a. Thus, the appropriate $I_{on}/I_{off}$ target for an active mode may differ substantially from that for a sleep or snooze mode. One way to accommodate multiple activity levels is to provide a set of parallel OFF transistors having differing widths which are coupled to switched supply voltages. For example, the transistors may have respective widths of (K·Won), (K·Won)/2, (K·Won)/4, (K·Won)/8, (K·Won)/16, and so on, where Won is the width of the ON transistor and K is the target value of Ion/Ioff when the circuit is running in a low activity mode. Any combination of the OFF transistors can be activated to obtain a modified value K in the case where the activity increases. That is, as the activity a increases, the target value of Ion/Ioff decreases, and thus the effective or selected width of the bank of OFF transistors decreases.

As explained above, the technique of one embodiment at least partially resides in maintaining the ratio $I_{on}/I_{off}$ at a selected target level, and various embodiments for achieving the target $I_{on}/I_{off}$ have been described above. One potential problem that may arise with these circuits resides in the fact that die threshold variations (i.e., the on-chip threshold variations) could cause the characteristics of the measurement transistors (i.e., the ON and OFF transistors) to deviate from the chip-wide average or critical path. In other words, there is no guarantee that the measurement transistors have characteristics representing an average across the die. The probability that one or two transistors picked at random will be "average" may be fairly small.

As such, according to another aspect of the invention, the leakage of a number of different transistors is measured as a function of back-bias to determine, on a statistical basis, what the average leakage is across the die, or across the critical path of the die. In this manner, the mean or average leakage of the particular die is obtained. Then, a measurement is made of the leakage of the measurement transistors forming the tuning circuit to determine the deviation of the measurement transistors from the die mean or average. Then, a number of techniques (described below) may be adopted to compensate for any deviation between the tuning circuit transistors and the die mean or average. Thus, through additional testing on an individual die during manufacturing, it is possible to zero-out the manufacturing variation that comes from the sample tuning circuit not being representative of the chip. This is particularly advantageous in low-threshold voltage devices where even very small threshold variations may not be acceptable.

One way to compensate for the tuning circuit deviations is to measure the on and off current of multiple sample transistors and then select a pair that is most representative of the die for use as the on and off transistors of the tuning circuit. The pair can be selected from among the measured sample transistors, or from among a dedicated set or bank of test transistors. For example, the transistors at the center of the leakage distribution can be selected for use in the tuning circuit. In this case, measured transistors are preferably distributed throughout the die or critical path.

Another way to compensate for the tuning circuit deviations is to measure the on and off current of multiple sample transistors to determine a representative leakage for the die, and then to adjust the width of the off transistor in the tuning circuit by mechanically trimming. By adjusting the width of the off transistor in this manner, the $I_{on}/I_{off}$ ratio measured by the comparator of the tuning circuit can be made to represent the die average or mean.

Yet another way to compensate for the tuning circuit deviations is to measure the on and off current of multiple sample transistors to determine a representative leakage for the die, and then to adjust the effective width of the off transistor in the tuning circuit by electronic multiplexing. For example, the chip may be provided with a small amount of flash EPROM, or laser links can be burned, to select among a bank of parallel-connected off transistors such as those discussed previously in connection with FIG. 8. Again, in this manner, the $I_{on}/I_{off}$ ratio measured by the comparator of the tuning circuit can be made to represent the die average or mean.

Still another way to compensate for the tuning circuit deviations relates to the embodiment discussed above in connection with FIG. 7. In this case, after measuring the leakage of multiple sample transistors to determine a representative leakage for the die, the sampling time K·t is adjusted at which the capacitor voltage is compared with the preset voltage. In this manner, the back bias is adjusted in a manner commensurate with the die average.

In an alternative embodiment, the width or sampling time is adjusted after measuring the conditions under which the chip meets performance specifications, as opposed to measuring the leakage characteristics of multiple transistors to determined a representative leakage for the die, In this case, the performance of the circuit is measured, and the $I_{on}/I_{off}$ ratio is set to the maximum value at which the chip to operates error free under worst case operating conditions. For example, under worst case operating conditions, the back bias may be increased until the circuit fails. Then, the back bias is decreased to a margin at which the circuit is again operational, and the center of the tuning circuit is set to that point using any of the techniques described above. This minimizes leakage while meeting worst case performance.

Each of the techniques described above provide a mechanism for ensuring that the $I_{on}/I_{off}$ ratio of the test transistors is kept constant at the right value, eliminating a source of variation that could degrade performance by resulting in a larger threshold voltage in some critical path due to a low threshold voltage in the test structure of the tuning circuit.

As a separate matter, in cases where there is only one p well potential for the whole die, only one back biased tuning circuit is needed per die. However, some die structures will have multiple n well potentials. Also, in a triple well process, there could be multiple p wells. Accordingly, multiple tuning circuits may be employed in a single die, i.e., one tuning circuit may be provided for each well of the die. In this case, the tuning circuit calibration described above can be applied separately to each well.

Both the target $I_{on}/I_{off}$ techniques and the die compensation techniques discussed herein can be readily applied to transistor structures other than those described herein. That is, the present invention can be applied other known structures which include mechanisms for controlling threshold voltages. These include, but are not limited to, body contacted partially depleted SOI (silicon-on-insulator) transistors, back gated fully depleted SOI transistors, and back gated polysilicon thin film transistors.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling within the scope of the invention.

What is claimed is:

1. A method of forming a semiconductor device, comprising:

forming a back-bias potential tuning circuit which tunes a bias potential applied to a semiconductor die to bring a threshold voltage of at least one channel region within the semiconductor die to a target value;

measuring a leakage current of multiple transistors formed in the semiconductor die;

determining a representative leakage of the semiconductor die from the measured leakage of the multiple transistors; and setting a tuning characteristic of the back-bias potential tuning circuit to match the representative leakage of the semiconductor die.

2. A method as claimed in claim 1, wherein said setting a tuning characteristic includes selecting at least one of the multiple transistors for use as a test transistor in the back-bias potential tuning circuit.

3. A method as claimed in claim 1, wherein said setting a tuning characteristic includes mechanically trimming a width of a test transistor of the back-bias potential tuning circuit.

4. A method as claimed in claim 1, wherein said setting a tuning characteristic includes activating selected transistors among a bank of parallel connected transistors, and using the activated transistors as a test transistor of the back-bias potential tuning circuit.

5. A method as claimed in claim 1, wherein the back-bias potential tuning circuit includes a capacitor which is charged via a second transistor during an on-interval of the second transistor and which is discharged via a first transistor during an off-interval of the second transistor, wherein the back-bias potential tuning circuit brings the threshold voltage to the target voltage by measuring a voltage of the capacitor at a sampling time of the off-interval of the second transistor, and controlling a back-bias potential to bring the measured voltage to a target voltage, and wherein said setting a tuning characteristic includes setting the sampling time at which the voltage of the capacitor is measured during the off-interval of the second transistor.

6. A method as claimed in claim 1, wherein the back-bias potential tuning circuit brings the threshold voltage to the target voltage by measuring a current ratio between an on transistor and an off transistor within the semiconductor die, and controlling a back-bias potential to bring the measured current ratio to a target ratio, and wherein said setting a tuning characteristics includes setting a ratio between a channel width of the off transistor and a channel width of the on transistor.

7. A method as claimed in claim 6, wherein the target ratio is between 10 and 10,000 inclusive.

8. A method as claimed in claim 1, wherein the back-bias potential tuning circuit is formed on the semiconductor die.

9. A method as claimed in claim 1, wherein the back-bias potential tuning circuit is formed off the semiconductor die.

10. A method of forming a semiconductor device comprising:

forming a back-bias potential tuning circuit which tunes a bias potential applied to a semiconductor die to bring a threshold voltage of at least one channel region within the semiconductor die to a target value;

subjecting the semiconductor die to worst case operating conditions and determining a target back-bias potential at which the semiconductor die is operational under the worst case operating conditions; and setting a tuning characteristic of the back-bias potential tuning circuit to cause the tuning circuit to generate the target back-bias potential under the worst case operating conditions.

11. A method as claimed in claim 10, wherein said setting a tuning characteristic includes selecting at least one of multiple transistors for use as a test transistor in the back-bias potential tuning circuit.

12. A method as claimed in claim 10, wherein said setting a tuning characteristic includes mechanically trimming a width of a test transistor of the back-bias potential tuning circuit.

13. A method as claimed in claim 10, wherein said setting a tuning characteristic includes activating selected transistors among a bank of parallel connected transistors, and using the activated transistors as a test transistor of the back-bias potential tuning circuit.

14. A method as claimed in claim 10, wherein the back-bias potential tuning circuit includes a capacitor which is charged via a second transistor during an on-interval of the second transistor and which is discharged via a first transistor during an off-interval of the second transistor, wherein the back-bias potential tuning circuit brings the threshold voltage to the target voltage by measuring a voltage of the capacitor at a sampling time of the off-interval of the second transistor, and controlling a back-bias potential to bring the measured voltage to a target voltage, and wherein said setting a tuning characteristic includes setting the sampling time at which the voltage of the capacitor is measured during the off-interval of the second transistor.

15. A method as claimed in claim 10, wherein the back-bias potential tuning circuit brings the threshold voltage to the target voltage by measuring a current ratio between an on transistor and an off transistor, and controlling a back-bias potential to bring the measured current ratio to a target ratio, and wherein said setting a tuning characteristics includes setting a ratio between a channel width of the off transistor and a channel width of the on transistor.

16. A method as claimed in claim 15, wherein the target current ratio is between 10 and 10,000 inclusive.

17. A method as claimed in claim 10, wherein the back-bias potential tuning circuit is formed on the semiconductor die.

18. A method as claimed in claim 10, wherein the back-bias potential tuning circuit is formed off the semiconductor die.

* * * * *